(12) United States Patent
Bogen et al.

(10) Patent No.: US 9,392,714 B2
(45) Date of Patent: Jul. 12, 2016

(54) POWER SEMICONDUCTOR MODULE AND METHOD OF MANUFACTURING A POWER SEMICONDUCTOR

(71) Applicant: Semikron Elektronik GmbH & Co., KG, Nürnberg (DE)

(72) Inventors: Ingo Bogen, Nürnberg (DE); Jörn Großmann, Nürnberg (DE); Christian Walter, Ansbach (DE); Christian Göbl, Nürnberg (DE); Patrick Graschl, Wolframs-Eschenbach (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/227,951

(22) Filed: Mar. 27, 2014

(65) Prior Publication Data

US 2014/0293552 A1    Oct. 2, 2014

(30) Foreign Application Priority Data

Mar. 27, 2013    (DE) .................... 10 2013 103 116

(51) Int. Cl.
| | |
|---|---|
| *H05K 7/00* | (2006.01) |
| *H05K 5/06* | (2006.01) |
| *H01L 23/29* | (2006.01) |
| *H05K 7/02* | (2006.01) |
| *H05K 13/00* | (2006.01) |

(52) U.S. Cl.
CPC .............. *H05K 5/069* (2013.01); *H01L 23/293* (2013.01); *H01L 23/296* (2013.01); *H05K 7/02* (2013.01); *H05K 13/00* (2013.01); *H01L 2924/0002* (2013.01); *Y10T 29/41* (2015.01)

(58) Field of Classification Search
USPC ......... 361/728–730, 715, 752, 800, 820, 783, 361/716, 733; 257/776–778; 174/667, 658, 174/650, 662; 439/78
See application file for complete search history.

(56) References Cited

U.S. PATENT DOCUMENTS

| | | | |
|---|---|---|---|
| 4,007,477 A | | 2/1977 | Goodman |
| 5,277,610 A | * | 1/1994 | Krehbiel ............... H01R 13/74 439/271 |

(Continued)

FOREIGN PATENT DOCUMENTS

| | | |
|---|---|---|
| DE | 14 89 097 | 10/1970 |
| DE | 101 20 402 | 11/2002 |

*Primary Examiner* — Hung S Bui
(74) *Attorney, Agent, or Firm* — The Law Offices of Roger S. Thompson

(57) ABSTRACT

A power semiconductor module, and method for its manufacture, comprising a first housing part having a cutout and a DC voltage load connection apparatus forming a structural unit, wherein the DC voltage load connection apparatus has first and second DC voltage load connection elements. The first DC voltage load connection element has a first leadthrough section arranged in the cutout, and the second DC voltage load connection element has a second leadthrough section arranged in the cutout forming a gap therebetween. The first and second leadthrough sections are sheathed by an elastomer, which fills the gap, is cohesively connected to the first and second leadthrough sections and seals off the first and second leadthrough sections with respect to the first housing part. The inventive power semiconductor module exhibits a high resistance to thermal cycling, and the distance between the DC voltage load connection elements can be configured to be small.

10 Claims, 6 Drawing Sheets

(56) References Cited

U.S. PATENT DOCUMENTS

| | | | |
|---|---|---|---|
| 6,462,955 B1* | 10/2002 | Roberts | H05K 3/303 174/268 |
| 6,597,585 B2* | 7/2003 | Ferber | H01L 25/072 257/698 |
| 7,580,266 B2* | 8/2009 | Miller | A22B 5/0064 361/728 |
| 7,723,619 B2* | 5/2010 | Ohashi | B29C 45/0025 174/260 |
| 7,848,112 B2* | 12/2010 | Matsumoto | H01R 4/04 361/730 |
| 8,599,563 B2* | 12/2013 | Liao | H05K 5/0247 361/728 |
| 8,933,554 B2* | 1/2015 | Kodaira | H01L 23/34 257/584 |

* cited by examiner

POWER SEMICONDUCTOR MODULE AND METHOD OF MANUFACTURING A POWER SEMICONDUCTOR

BACKGROUND OF THE INVENTION

1. Field of the Invention

The invention relates to a power semiconductor module and to a method for manufacturing a power semiconductor module.

2. Description of the Related Art

In known power semiconductor modules, power semiconductor components, such as, for example, power semiconductor switches and diodes, are generally arranged on a substrate and electrically conductively connected to one another by means of a conductor layer of the substrate, and bonding wires and/or a foil composite. The power semiconductor switches are in this case generally in the form of transistors, such as, for example, IGBTs (insulated gate bipolar transistors) or MOSFETs (metal oxide semiconductor field effect transistors) or in the form of thyristors.

In this case, the power semiconductor components arranged on the substrate are often electrically connected to one another to form one or more so-called half-bridge circuits, which are used, for example, for rectifying and inverting electrical voltages and currents.

Conventional power semiconductor modules have DC voltage load connection elements for conducting load currents, with the aid of which DC voltage load connection elements the power semiconductor components are electrically conductively connected to the external environment. The load currents in this case generally have a high current intensity, in contrast to auxiliary currents which are used, for example, for actuating the power semiconductor switches. The DC voltage load connection elements generally need to be passed through the housing of the power semiconductor module. In this case, the demand is often made of power semiconductor modules to have protection from spray water (for example, to the level of IP54), for example, with the result that the DC voltage load connection elements need to be sealed off with respect to the housing. Since the DC voltage load connection elements generally need to be guided ideally parallel to one another and at a small distance from one another in order to realize a self-inductance which is as low as possible, sealing of the DC voltage load connection elements with respect to the housing is difficult to implement. In the case of conventional power semiconductor modules, the DC voltage load connection elements are injection-molded into the housing, which generally consists of a thermoplastic, or the interior of the power semiconductor module is cast by means of a casting compound after fitting of the power semiconductor module.

In conventional power semiconductor modules, the DC voltage load connection elements are cohesively connected to the housing in order to seal the DC voltage load connection elements with respect to the housing.

Conventional solutions for sealing the DC voltage load connection elements with respect to the housing in this case have only poor resistance to thermal cycling. Furthermore, the distance between the DC voltage load connection elements needs to be relatively large if the DC voltage load connection elements are intended to be injection-molded into the housing so that the thermoplastic can flow between the DC voltage load connection elements and the formation of meld lines extending between the DC voltage load connection elements is avoided.

SUMMARY OF THE INVENTION

The object of the invention is to provide an improved power semiconductor and method for its manufacture which overcomes these drawbacks of the prior art.

It is an object of the invention to provide a power semiconductor module in which the DC voltage load connection elements are sealed off with respect to the housing of the power semiconductor module in a reliable manner and with a high resistance to thermal cycling, and the distance between the DC voltage load connection elements can be configured to be small.

This object is achieved by a power semiconductor module comprising a substrate and power semiconductor components which are arranged on the substrate and are connected to the substrate, wherein the power semiconductor module has a first housing part with a cutout and a DC voltage load connection apparatus forming a structural unit, wherein the DC voltage load connection apparatus has first and second electrically conductive DC voltage load connection elements, which are each electrically conductively connected to at least one power semiconductor component. The first DC voltage load connection element includes a first external connection section arranged outside the first housing part, a first internal connection section arranged inside the first housing part, and a first leadthrough section arranged in the cutout. The second DC voltage load connection element includes a second external connection section arranged outside the first housing part, a second internal connection section arranged inside the first housing part, and a second leadthrough section arranged in the cutout. A gap is formed between the first and second leadthrough sections. The first and second leadthrough sections are sheathed by an electrically nonconductive elastomer which fills the gap, is cohesively connected to the first and second leadthrough sections, and is non-cohesively connected to the first housing part. The elastomer also seals off the first and second leadthrough sections with respect to the first housing part.

Furthermore, this object is achieved by a method for producing a power semiconductor module comprising a substrate and power semiconductor components, which are arranged on the substrate and are connected to the substrate, wherein the power semiconductor module has a first housing part having a cutout, and the method comprises the following steps:

arranging a DC voltage load connection apparatus forming a structural unit in the cutout, wherein the DC voltage load connection apparatus has a first and a second electrically conductive DC voltage load connection element, wherein the first DC voltage load connection element has a first external connection section and the second DC voltage load connection element has a second external connection section, wherein the first DC voltage load connection element has a first internal connection section, and the second DC voltage load connection element has a second internal connection section, wherein the first DC voltage load connection element has a first leadthrough section arranged between the first internal connection section and the first external connection section, and the second DC voltage load connection element has a second leadthrough section arranged between the second internal connection section and the second external connection section, wherein a gap is formed between the first and second leadthrough sections, wherein the first and second leadthrough sections are sheathed by an elastomer, and the elastomer fills the gap, wherein the elastomer is cohesively connected to the first and second leadthrough sections, wherein the DC voltage load connection apparatus is arranged in the cutout in such a way that, once the DC voltage load connection apparatus has been arranged, the first and second external connection sections are arranged outside the first housing part, and the first and second internal connection sections are arranged inside the first housing part, and the first and second leadthrough sections are arranged in the cutout, wherein the first and second leadthrough sections are sealed off with respect to the first housing part by the elastomer; and electrically conductively connecting the first and second DC voltage load connection elements in each case to at least one power semiconductor component.

Advantageous developments of the method result analogously to advantageous developments of the power semiconductor, and vice versa.

It has proven to be advantageous if the elastomer is in the form of silicone since a silicone has high dielectric strength.

Furthermore, it has proven advantageous if the elastomer forms a sealing lip, wherein the sealing lip presses against the first housing part. As a result, particularly reliable sealing of the first and second leadthrough sections with respect to the first housing part may be achieved.

In addition, it has proven to be advantageous if the power semiconductor module has a second housing part, connected to the first housing part, and a sealing device is arranged between the first and second housing parts and between the elastomer and the second housing part to seal off the second housing part with respect to the first housing part and the second housing part with respect to the elastomer. As a result, a power semiconductor module which is particularly simple to produce is provided.

Furthermore, it has proven to be advantageous if the sealing device is cohesively connected to the second housing part. As a result, a power semiconductor module which is particularly easy to produce is provided.

Furthermore, it has proven to be advantageous if the gap extends beyond the length of the first and second leadthrough sections arranged in the cutout, and the elastomer fills the gap over the entire length of the gap, and the first and second DC voltage load connection elements are sheathed by the elastomer over the entire length of the gap. As a result, a DC voltage load connection apparatus is provided which has a high dielectric strength. Furthermore, a power semiconductor module is thus also provided which has a high dielectric strength.

In addition, it has proven to be advantageous if a second housing part is connected to the first housing part, wherein a sealing device is arranged on the second housing part and is cohesively connected to the second housing part, wherein the second housing part is connected to the first housing part and the sealing device is arranged in such a way that, once the second housing part has been connected to the first housing part, the sealing device is arranged between the first and second housing parts and between the elastomer and the second housing part, and the second housing part is sealed off with respect to the first housing part and the second housing part is sealed off with respect to the elastomer by the sealing device. As a result, a power semiconductor module which is particularly easy to produce is provided.

Furthermore, it has proven to be advantageous if a sealing device is arranged on a second housing part or on the first housing part and then the second housing part is connected to the first housing part, wherein the second housing part is connected to the first housing part and the sealing device is arranged in such a way that, once the second housing part has been connected to the first housing part, the sealing device is arranged between the first and second housing parts and between the elastomer and the second housing part, and the second housing part is sealed off with respect to the first housing part and the second housing part is sealed off with respect to the elastomer by the sealing device. As a result, a particularly simple design of the sealing device is enabled.

Furthermore, it has proven to be advantageous if the elastomer is connected in a form-fitting manner to the first and second DC voltage load connection elements in all three spatial directions. If, in addition to the existing cohesive connection between the elastomer and the first and second leadthrough sections, the elastomer is connected in a form-fitting manner to the first and second DC voltage load connection elements in all three spatial directions, a particularly solid connection between the elastomer and the first and second DC voltage load connection elements is achieved.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
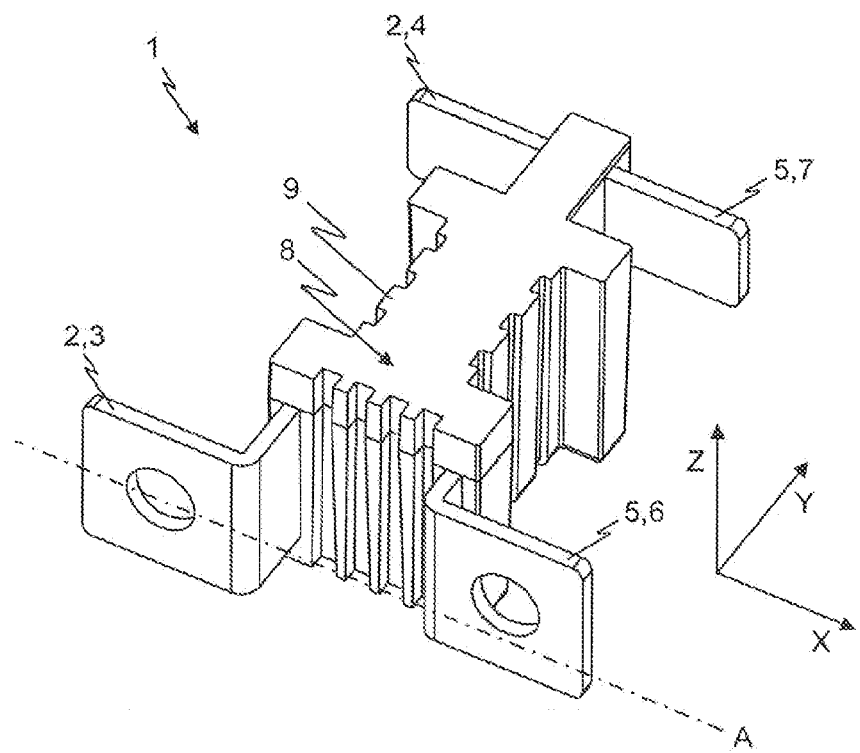
FIG. 1 shows a perspective illustration of a DC voltage load connection apparatus in accordance with the invention.
Figure 2:
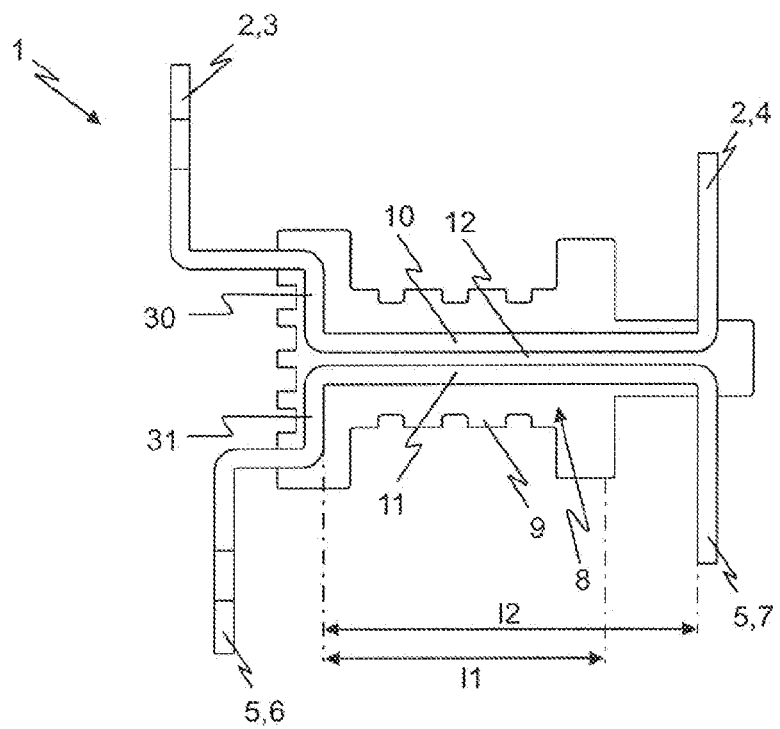
FIG. 2 shows a sectional illustration of a DC voltage load connection apparatus in accordance with the invention.
Figure 5:
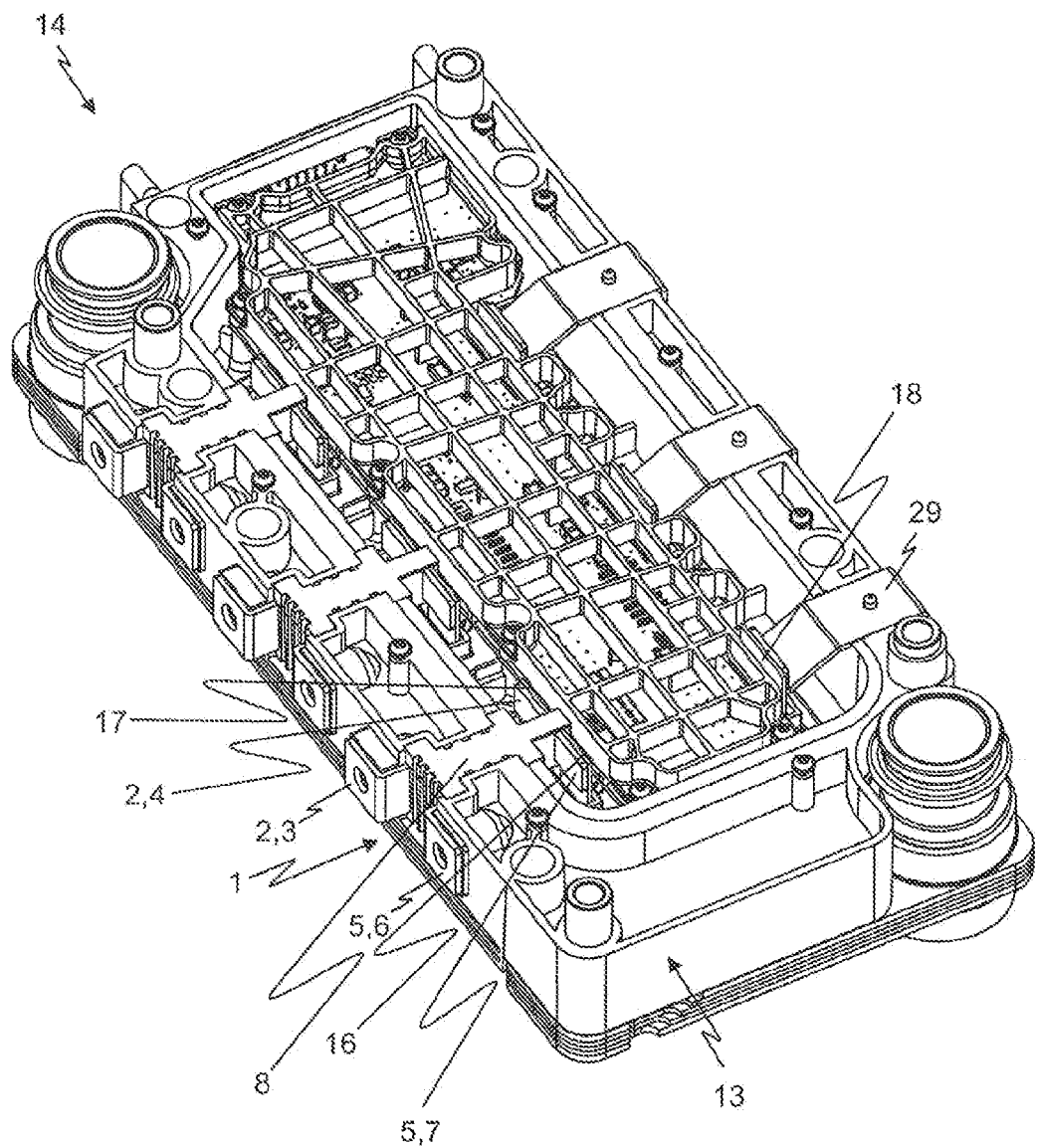
FIG. 5 shows a perspective illustration of a power semiconductor module according to the invention.

FIG. 1 shows a perspective illustration of a DC voltage load connection apparatus 1, which, in accordance with the invention, serves to conduct direct currents through a first housing part 13 of a power semiconductor module 14 according to the invention (see, FIG. 5). FIG. 2 shows a sectional illustration of DC voltage load connection apparatus 1, wherein the section runs along the line A illustrated in FIG. 1. DC voltage load connection apparatus 1 has a first electrically conductive DC voltage load connection element 2 and a second electrically conductive DC voltage load connection element 5. First DC voltage load connection element 2 has a first external connection section 3, and second DC voltage load connection element 5 has a second external connection section 6. Furthermore, first DC voltage load connection element 2 has a first internal connection section 4, and second DC voltage load connection element 5 has a second internal connection section 7. In addition, first DC voltage load connection element 2 has a first leadthrough section 10, and second DC voltage load connection element 5 has a second leadthrough section 11. First leadthrough section 10 is arranged between first external connection section 3 and first internal connection section 4. Second leadthrough section 11 is arranged between second external connection section 6 and second internal connection section 7.

A gap 12 is formed between first and second leadthrough sections 10 and 11. First and second leadthrough sections 10 and 11 are arranged in this way with a narrow spacing with respect to one another. First and second leadthrough sections 10 and 11 are sheathed by an electrically nonconductive elastomer 8, which fills gap 12. Elastomer 8 is cohesively connected to first and second leadthrough sections 10 and 11. DC voltage load connection apparatus 1 is therefore in the form of a structural unit and has first and second DC voltage load connection elements 2 and 5 and elastomer 8, which cohesively connects first and second DC voltage load connection elements 2 and 5 to one another. First and second DC voltage load connection elements 2 and 5 are preferably each designed to be integral.

Preferably, elastomer 8 is additionally connected in a form-fitting manner to first and second DC voltage load connection elements 2 and 5 in all three spatial directions X, Y and Z (FIG. 1). In the context of this exemplary embodiment, for this purpose first DC voltage load connection element 2 has a first section 30, which is bent back with respect to the first leadthrough section 10, and second DC voltage load connection element 5 has a second section 31, which is bent back with respect to second leadthrough section 11, wherein bent-back first and second sections 30 and 31 are sheathed by elastomer 8. Elastomer 8 is connected in a form-fitting manner to first and second leadthrough sections 10 and 11 in both spatial directions X and Z and is connected in a form-fitting manner to bent-back first and second sections 30 and 31 in both spatial directions Y and Z, with the result being that elastomer 8 is connected in a form-fitting manner to first and second DC voltage load connection elements 2 and 5 in all three spatial directions X, Y and Z.

Elastomer 8 is preferably made of silicone. The silicone is preferably in the form of a cured liquid silicone rubber or in the form of a cured solid silicone rubber. In the exemplary embodiment, elastomer 8 is in the form of a cured liquid silicone rubber. In order to produce DC voltage load connection apparatus 1, first and second DC voltage load connection elements 2 and 5 are preferably arranged in a two-part die. Then, a liquid preform of elastomer 8, which can be present in the form of a liquid silicone rubber, for example, is injection-molded into the die. Then, temperature loading takes place, as a result of which the liquid silicone rubber cures and solidifies to form elastomer 8. In contrast to a thermoplastic, a liquid silicone rubber can enter gap 12 very easily and fill this gap completely and homogeneously without meld lines being produced, with the result that first and second DC voltage load connection elements 2 and 5 are electrically insulated from one another in a reliable manner and in a manner resistant to thermal cycling.

Figure 3:
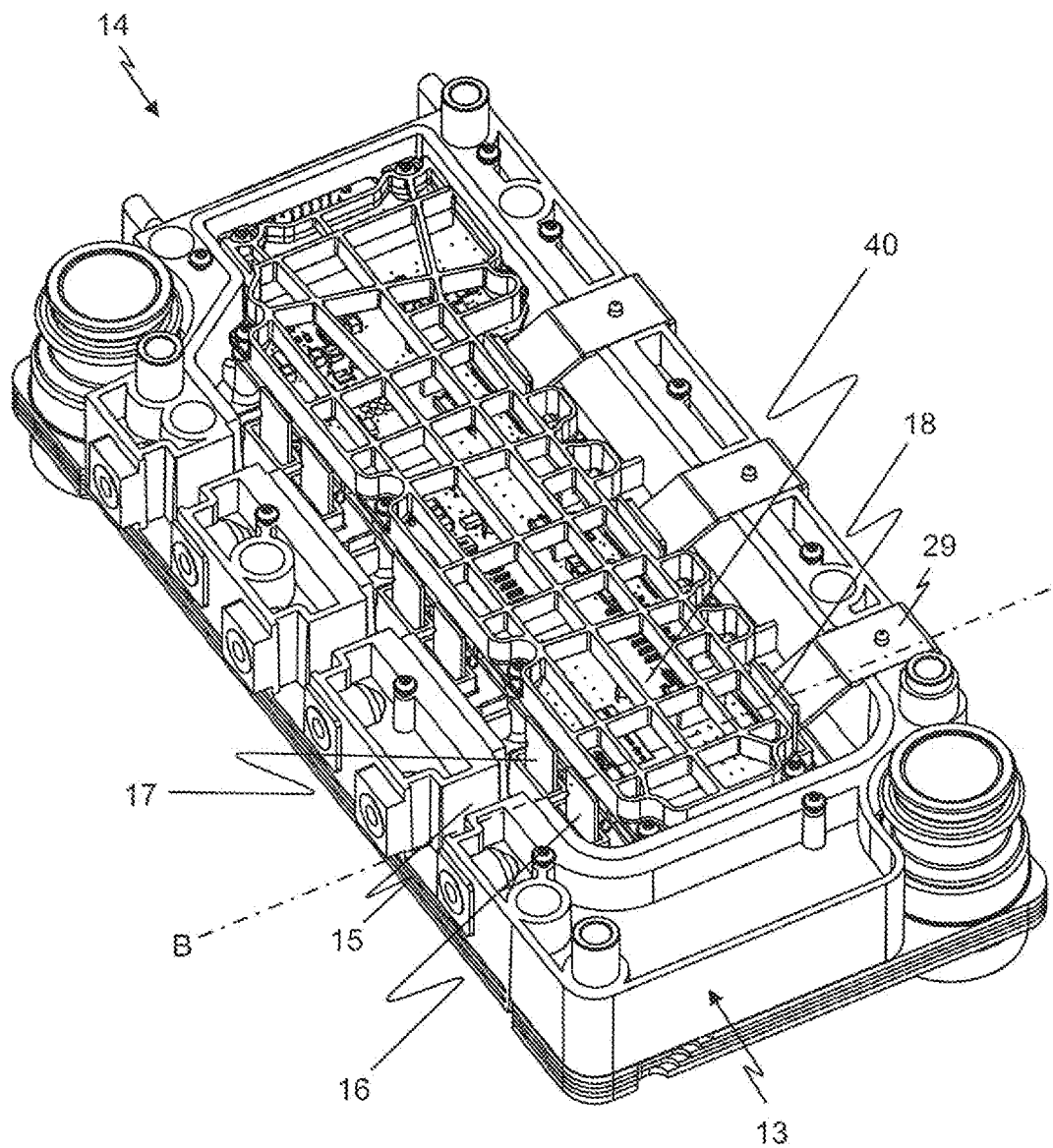
FIG. 3 shows a perspective illustration of a power semiconductor module according to the invention in an unfinished state.
Figure 4:
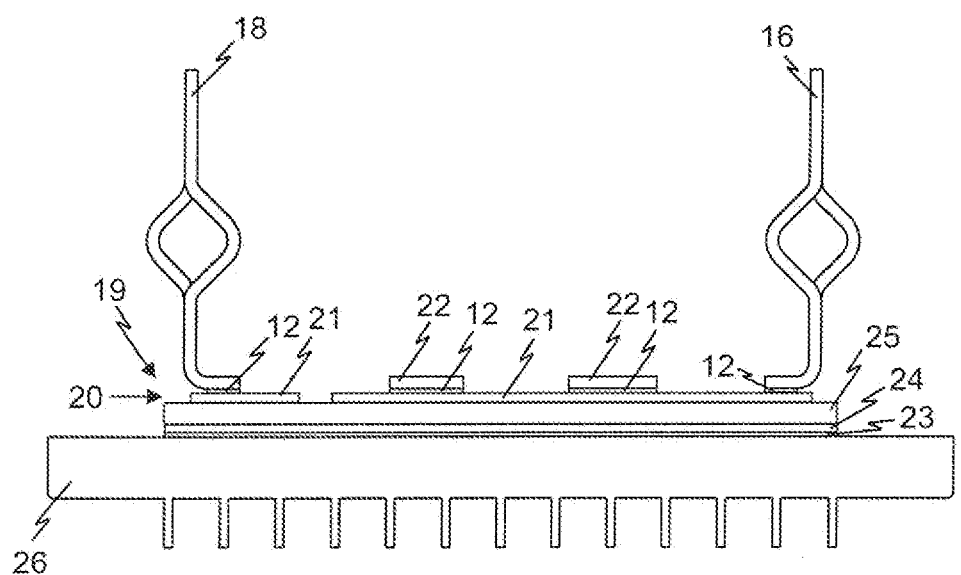
FIG. 4 shows a simplified sectional illustration of a substrate of the inventive power semiconductor module and of the elements of the power semiconductor module which are connected to the substrate.

FIG. 3 shows a perspective illustration of a power semiconductor module 14 according to the invention in the as yet unfinished state. FIG. 4 shows a schematized sectional illustration of a substrate 19 of power semiconductor module 14 according to the invention and of the elements of power semiconductor module 14 which are connected to substrate 19, wherein the section runs along line B illustrated in FIG. 3. Power semiconductor module 14 has a first housing part 13, which, in the exemplary embodiment, surrounds the power semiconductor components 22 of power semiconductor module 14 in the lateral direction. In the context of the exemplary embodiment, first housing part 13 has three cutouts for passing through direct currents, while, for reasons of clarity, only one cutout 15 has been provided with a reference numeral in the figures. It should be noted at this juncture that, in the context of the exemplary embodiment, a three-phase power semiconductor module 14 is illustrated, in which a DC voltage is inverted to give a three-phase AC voltage or a three-phase AC voltage is rectified to give a DC voltage. The following description describes, by way of example, the design of power semiconductor module 14, as regards a substrate and the elements associated with the substrate, with respect to the generation of a single-phase AC voltage. Substrate 19 and the relevant arrangement for generating the single-phase AC voltage is provided in triplicate with an identical embodiment in the context of the exemplary embodiment, with the result that, as has already been described above, a three-phase AC voltage is generated by power semiconductor module 14 from a DC voltage or a three-phase AC voltage is rectified to give a DC voltage. First housing part 13 preferably consists of a thermoplastic and is preferably in the form of an injection-molded part.

Power semiconductor module 1 has a substrate 19, which in the exemplary embodiment is in the form of a DCB substrate and has power semiconductor components 22 which are arranged on, and are connected to, substrate 19. The respective power semiconductor component is preferably in the form of a power semiconductor switch or a diode. The power semiconductor switches are in this case generally in the form of transistors, such as, for example, IGBTs (insulated gate bipolar transistors) or MOSFETs (metal oxide semiconductor field effect transistors) or in the form of thyristors. In the context of the exemplary embodiment, power semiconductor components 22 have, on their side facing substrate 19, a respective first power semiconductor load current connection (for example, an emitter) and, on their side facing away from substrate 19, a respective second power semiconductor load current connection (for example, a collector).

Substrate 19 has an insulating body 25 and an electrically conductive structured first conduction layer 20, which is arranged on a first side of insulating body 25, is connected to insulating body 25 and, in the context of the exemplary embodiment, forms conductor tracks 21. Preferably, substrate 19 has an electrically conductive, preferably unstructured, second conduction layer 24, wherein insulating body 25 is arranged between structured first conduction layer 20 and second conduction layer 24. Structured first conduction layer 20 of substrate 19 can consist of copper, for example. Substrate 19 can be in the form of a direct copper bonded substrate (DCB substrate), as in the exemplary embodiment, or in the form of an insulated metal substrate (IMS). In the case of a DCB substrate, insulating body 25 can consist of a ceramic, and second conduction layer 24 of substrate 19 can consist of copper, for example. In the case of an insulated metal substrate, insulating body 25 can consist of a layer of polyimide or epoxy, for example, and second conduction layer 24 of substrate 19 can consist of a metal molding. The metal molding can be made of aluminium or an aluminium alloy, for example.

Furthermore, power semiconductor module 1 has electrically conductive DC voltage connecting elements 16 and 17, which, with finished power semiconductor module 14, connect substrate 19, more precisely first conduction layer 20 of substrate 19, to a respectively associated electrically conductive DC voltage load connection element of DC voltage load connection apparatus 1. Furthermore, power semiconductor module 14 has an AC voltage connecting element 18, which connects, when the power semiconductor module 14 is finished, substrate 19, more precisely first conduction layer 20 of substrate 19, to an associated electrically conductive AC voltage load connection element 29. The load currents which flow through DC voltage load connection apparatus 1 and through AC voltage load connection element 29, in this case generally have a high current intensity in contrast to auxiliary currents which are used, for example, for actuating the power semiconductor components when the power semiconductor components are in the form of power semiconductor switches.

Preferably, the connection between power semiconductor components 22 and the substrate 19 and/or between DC voltage connecting elements 16 and 17 and substrate 19 and/or between AC voltage connecting element 18 and substrate 19 is realized in each case as a cohesive or force-fitting connection. The respective cohesive connection can be, for example, in the form of a welded, soldered, adhesively bonded or sintered joint, wherein, in the case of the connection between power semiconductor components 22 and substrate 19, said connection is preferably in the form of a soldered, adhesively bonded or sintered joint. In the case of an adhesively bonded joint, an electrically conductive adhesive is used.

In the context of the exemplary embodiment, the connections mentioned in the previous paragraph are realized as sintered joints, with the result that, in the exemplary embodiment, in each case one sintered layer 12 is arranged between power semiconductor components 22 and substrate 19 and between DC voltage connecting elements 16 and 17 and substrate 19, and between the AC voltage connecting element 18 and substrate 19.

Substrate 19 is preferably connected to a metal molding 25 on its side remote from power semiconductor components 22. Metal molding 26 can be in the form of a metal plate, for example, which is used for thermally connecting substrate 19 to a heat sink, or is itself in the form of a heat sink, as in the exemplary embodiment. The heat sink preferably has cooling fins or cooling knobs. The connection between substrate 19 and metal molding 26 can be realized as a cohesive or force-fitting connection. The cohesive connection can be in the form of a welded, soldered, adhesively bonded or sintered joint, for example, wherein the use of a sintered joint is particularly advantageous since this has a high mechanical strength and a high thermal conductivity. In the exemplary embodiment, the connection between substrate 19 and metal molding 26 is realized as a sintered joint, with the result that a sintered layer 23 is arranged between substrate 19 and metal molding 26.

It should be noted at this juncture that, within the meaning of the invention, a "heat sink" is understood to mean a solid body which is used, during operation of the power semiconductor module, to absorb heat from another solid body and to emit the absorbed heat or the majority of the absorbed heat to a liquid medium and/or to a gaseous medium which has contact with the heat sink. If appropriate, a small proportion of the heat absorbed by the heat sink can be emitted to a still further solid body.

It should furthermore be noted that power semiconductor components 22 are electrically conductively connected to one another and to conductor tracks 21 of substrate 19, corresponding to the desired electrical circuit which is intended to realize power semiconductor module 14, on that side of said power semiconductor components which is remote from substrate 19 by means of bonding wires and/or a film composite, for example. For reasons of clarity, these electrical connections are not illustrated in FIG. 4.

As illustrated in FIG. 3, power semiconductor module 14 preferably has a printed circuit board 40, on which the electrical driver circuits required for actuating the power semiconductor switches of power semiconductor module 14 are realized.

A method according to the invention for producing power semiconductor module 14 according to the invention will be described below.

In a first method step, the DC voltage load connection apparatus 1 forming a structural unit is arranged in cutout 15 in first housing part 13, wherein DC voltage load connection apparatus 1 is arranged in cutout 15 in such a way that, once DC voltage load connection apparatus 1 has been arranged, first and second external connection sections 3 and 6 of DC voltage load connection apparatus 1 are arranged outside first housing part 13, and the first and second internal connection sections 4 and 7 of DC voltage load connection apparatus 1 are arranged inside first housing part 13, and first and second leadthrough sections 10 and 11 are arranged in cutout 15, wherein first and second leadthrough sections 10 and 11 are sealed off with respect to first housing part 13 by elastomer 8 of DC voltage load connection apparatus 1. Elastomer 8 is therefore non-cohesively connected to first housing part 13. Elastomer 8 is connected in a form-fitting manner, in particular preferably exclusively in a form-fitting manner, to first housing part 13. Elastomer 8 is detachably connected to first housing part 13. In the context of the exemplary embodiment, DC voltage load connection apparatus 1 forming a structural unit is arranged in cutout 15 by virtue of DC voltage load connection apparatus 1 being inserted into cutout 15.

FIG. 5 shows a perspective illustration of inventive power semiconductor module 14, in which DC voltage load connection apparatus 1 has been inserted into cutout 15 in first housing part 13.

Preferably, gap 12 extends beyond length l1 of first and second leadthrough sections 10 and 11 arranged in cutout 15, and elastomer 8 fills gap 12 formed between first and second DC voltage load connection elements 2 and 5 over the entire length l2 of gap 12, and first and second DC voltage load connection elements 2 and 5 are sheathed by elastomer 8 over the entire length l2 of gap 12 (see, FIG. 2). As a result, a high dielectric strength is achieved between first and second DC voltage load connection elements 2 and 5.

It should be noted at this juncture that cutout 15 of first housing part 13 can also be in the form of a through-hole passing through first housing part 13, and the arrangement of DC voltage load connection apparatus 1 forming the structural unit into cutout 15 in first housing part 13 can be provided by virtue of DC voltage load connection apparatus 1 being plugged into the through-hole, wherein, in this case, first and second internal connection sections 4 and 7 of DC voltage load connection apparatus 1 preferably do not have, as in the exemplary embodiment, a region which is bent back with respect to first and second leadthrough sections 10 and 11, but at least substantially corresponds to the direction of extent of first and second leadthrough sections 10 and 11.

Preferably, elastomer 8 forms a sealing lip 9 (see, FIG. 2), wherein sealing lip 9 presses against first housing part 13. Preferably, elastomer 18, as in the exemplary embodiment, forms a plurality of sealing lips arranged one behind the other, which press against first housing part 13.

It is furthermore noted that the housing of power semiconductor module 14 can also consist solely of a single housing part.

In a further method step, first and second DC voltage load connection elements 2 and 5 are each electrically conductively connected to at least one power semiconductor component 22 of power semiconductor module 14. In the context of the exemplary embodiment, for this purpose first internal connection section 4 of first DC voltage load connection element 2 is connected to DC voltage connecting element 17, and second internal connection section 7 of second DC voltage load connection element 5 is connected to DC voltage connecting element 16, wherein the respective connection can be in the form of a welded, soldered, adhesively bonded or sintered joint, for example. Similarly, preferably AC voltage load connection element 29 is connected to AC voltage connecting element 8.

It is noted that, within the meaning of the present invention, the expression whereby two elements are "electrically conductively connected" is understood to include both a direct electrically conductive connection of two elements, for example by means of a welded, soldered or sintered joint existing between the two elements, and an indirect electrically conductive connection, by means of, for example, one or more intermediate conduction elements, such as a conductor track, a bonding wire, an electrically conductive film composite, a busbar, a DC voltage connecting element, an AC voltage connecting element or a cable which electrically connect the two elements to one another, with the result that a bidirectional electrical current flow is possible between the two elements which are "electrically conductively connected" to one another.

Figure 6:
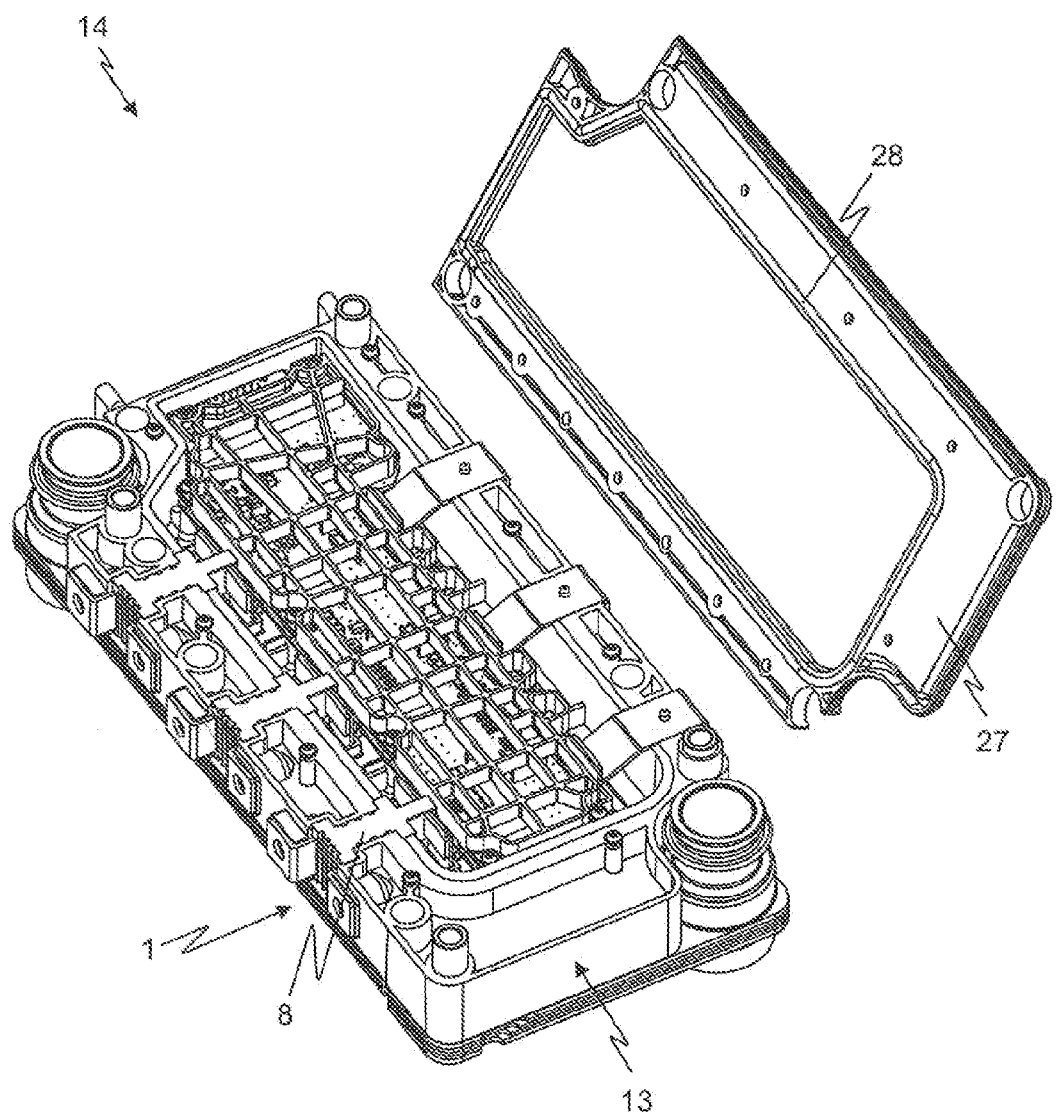
FIG. 6 shows a perspective illustration of a power semiconductor module according to the invention comprising a second housing part which has not yet been connected to the first housing part.
Figure 7:
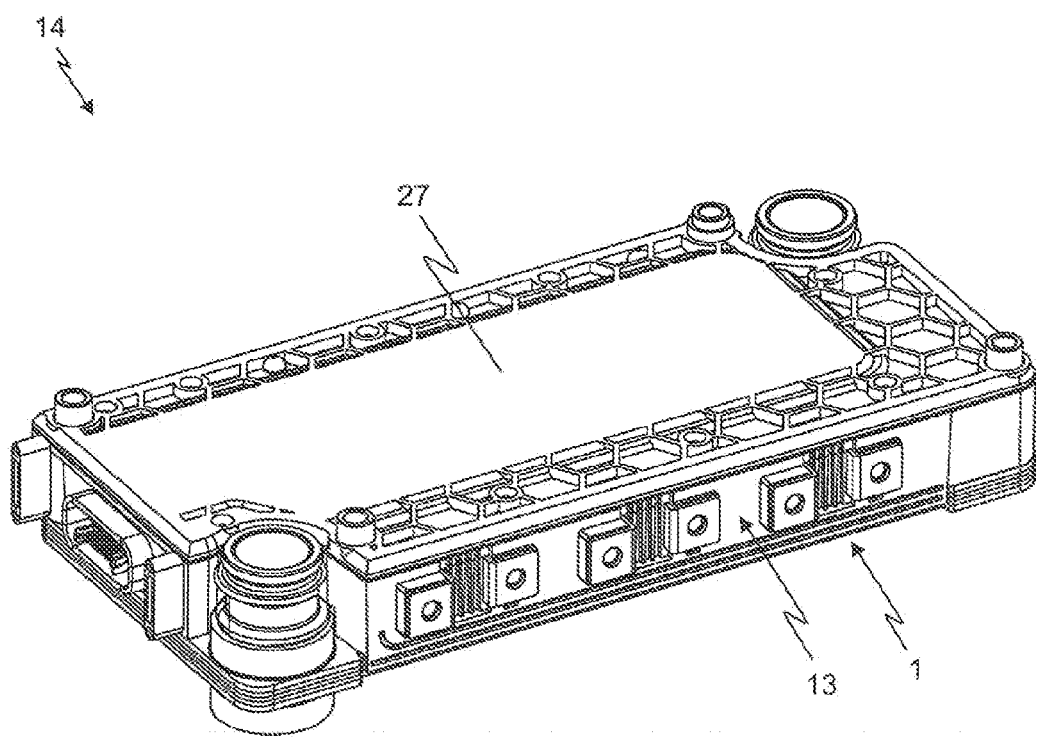
FIG. 7 shows a perspective illustration of a power semiconductor module according to the invention comprising a second housing part connected to the first housing part.

Preferably, in a further method step, a second housing part 27 is connected to first housing part 13, wherein a sealing device 28 is arranged on second housing part 27 and is cohesively connected to second housing part 27, wherein second housing part 27 is connected to first housing part 13 and sealing device 28 is arranged in such a way that, once second housing part 27 has been connected to first housing part 13, sealing device 28 is arranged between first and second housing parts 13 and 27, and between elastomer 8 of DC voltage load connection apparatus 1 and second housing part 27, and second housing part 27 is sealed off with respect to first housing part 13 and second housing part 27 is sealed off with respect to elastomer 8 by sealing device 28. In the context of the exemplary embodiment, second housing part 27 is in the form of a housing cover. FIG. 6 shows a perspective illustration of inventive power semiconductor module 14 comprising a second housing part 27 which as yet is not connected to first housing part 13, and FIG. 7 shows a perspective illustration of inventive power semiconductor module 14 comprising a second housing part 27 connected to first housing part 13. Sealing device 28 is arranged on that side of second housing part 27 which faces first housing part 13. In the context of the exemplary embodiment, sealing device 28 consists of an elastic material, such as silicone or rubber, for example, which is arranged so as to be closed peripherally.

It is noted here that sealing device 28 does not necessarily need to be cohesively connected to second housing part 27, but can also be in the form of a separate element, which can be in the form of a sealing ring, for example, and can consist of an elastic material, such as silicone or rubber, for example. In this case, sealing device 28 is arranged on second housing part 27 or on first housing part 13, and then second housing part 27 is connected to first housing part 13, wherein second housing part 27 is connected to first housing part 13 and sealing device 28 is arranged in such a way that, once second housing part 27 has been connected to first housing part 13, sealing device 28 is arranged between first and second housing parts 13 and 27 and between elastomer 8 and second housing part 27, and second housing part 27 is sealed off with respect to first housing part 13 and second housing part 27 is sealed off with respect to elastomer 8 by sealing device 28.

In the context of the exemplary embodiment, second housing part 27 is connected to first housing part 13 by means of a screw connection. Alternatively, second housing part 27 could also be connected to first housing part 13, for example by means of a snap-action latching connection or another type of connection.

In the context of the exemplary embodiment, during operation of inventive power semiconductor module 14 first DC voltage load connection element 2 has a positive electrical voltage potential, and second DC voltage load connection element 5 has a negative electrical voltage potential.

In the context of the exemplary embodiment, the housing of power semiconductor module 14 has a first and a second housing part 13 and 27.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a substrate;
   at least one power semiconductor component arranged on said substrate and connected to said substrate;
   a first housing part which includes a cutout and a DC voltage load connection apparatus forming a structural unit, the DC voltage load connection apparatus having first and second electrically conductive DC voltage load connection elements, each of said first and second electrically conductive DC voltage load connection elements being electrically conductively connected to at least one power semiconductor component;
   said first DC voltage load connection element including a first external connection section arranged outside said first housing part, a first internal connection section arranged inside said first housing part, and a first leadthrough section arranged in said cutout;

said second DC voltage load connection element including a second external connection section arranged outside said first housing part, a second internal connection section arranged inside said first housing part, and a second leadthrough section arranged in said cutout;

wherein a gap is formed between said first and second leadthrough sections; and an electrically nonconductive elastomer which sheaths said first and second leadthrough sections, and fills said gap, said elastomer being cohesively connected to said first and second leadthrough sections and being non-cohesively connected to said first housing part;

whereby said elastomer seals off said first and second leadthrough sections with respect to said first housing part.

2. The power semiconductor module of claim 1, wherein said elastomer is made of silicone.

3. The power semiconductor module of one claim 1, wherein said elastomer forms a sealing lip which presses against said first housing part.

4. The power semiconductor module of claim 1, further comprising:

a second housing part connected to said first housing part; and a sealing device arranged between said first and second housing parts and between said elastomer and said second housing part;

whereby said sealing device seals off said second housing part with respect to said first housing part and said second housing part with respect to said elastomer.

5. The power semiconductor module of claim 4, wherein said sealing device is cohesively connected to said second housing part.

6. The power semiconductor module of claim 1, wherein said gap extends beyond the length of said first and second leadthrough sections arranged in said cutout;

wherein said elastomer fills said gap over the entire length of said gap; and wherein said first and second DC voltage load connection elements are sheathed by said elastomer over the entire length of said gap.

7. The power semiconductor module of claim 1, wherein said elastomer is connected in a form-fitting manner to said first and second DC voltage load connection elements in all three spatial directions.

8. A method for producing a power semiconductor module comprising a substrate and at least one power semiconductor component arranged on the substrate and connected to the substrate, wherein the power semiconductor module has a first housing part with a cutout, the method comprising the following steps:

arranging a DC voltage load connection apparatus, forming a structural unit, in the cutout, wherein said DC voltage load connection apparatus has a first electrically conductive DC voltage load connection element which includes a first external connection section, a first internal connection section, and a first leadthrough section arranged between said first internal connection section and said first external connection section, wherein said DC voltage load connection apparatus has electrically conductive DC voltage load connection element which includes a second external connection section, a second internal connection section, and a second leadthrough section arranged between said second internal connection section and said second external connection section;

forming a gap between said first and second leadthrough sections;

sheathing said first and second leadthrough sections with an elastomer which fills said gap and is cohesively connected to said first and second leadthrough sections;

arranging said DC voltage load connection apparatus in said cutout so that, once said DC voltage load connection apparatus has been arranged, said first and second external connection sections are arranged outside said first housing part, said first and second internal connection sections are arranged inside said first housing part, and said first and second leadthrough sections are arranged in said cutout;

sealing off said first and second leadthrough sections with respect to said first housing part with said elastomer; and electrically conductively connecting said first and second DC voltage load connection elements in each case to at least one power semiconductor component.

9. The method of claim 8 further comprising the steps of:

connecting a second housing part to said first housing part;

arranging a sealing device on said second housing part;

arranging said sealing device so that, once said second housing part has been connected to said first housing part, said sealing device is arranged between said first and second housing parts and between said elastomer and said second housing part, and said second housing part is sealed off with respect to said first housing part and said second housing part is sealed off with respect to said elastomer by said sealing device.

10. The method of claim 9 further comprising the step of cohesively connecting said second housing part to said first housing part.

* * * * *